United States Patent [19]
Walkup et al.

[11] Patent Number: 6,004,152
[45] Date of Patent: Dec. 21, 1999

[54] ZIF PGA SOCKET

[75] Inventors: William B. Walkup, Hillsboro, Oreg.; Robert G. McHugh, Evergreen, Colo.; Ming-Lun Seu, Taipei, Taiwan

[73] Assignee: Hon Hai Precision Ind. Co., Ltd., Taipei Hsien, Taiwan

[21] Appl. No.: 09/131,140

[22] Filed: Aug. 7, 1998

[51] Int. Cl.⁶ .................................................. H01R 4/50
[52] U.S. Cl. ............................................ 439/342; 439/259
[58] Field of Search ............................... 439/259, 342

[56] References Cited

U.S. PATENT DOCUMENTS

| | | | |
|---|---|---|---|
| 5,679,020 | 10/1997 | Lai et al. | 439/342 |
| 5,762,511 | 6/1998 | Scheitz et al. | 439/342 |
| 5,833,483 | 11/1998 | Lai et al. | 439/342 |

*Primary Examiner*—Michael L. Gellner
*Assistant Examiner*—Antoine Ngandjui

[57] ABSTRACT

A ZIF socket includes a cover slidably engaged with a base to which a cam is pivotably connected. The cam is selectively rotated in a clockwise or counter-clockwise direction thereby driving the cover to move laterally in opposite directions with respect to the base. The rotational plane of the cam is substantially parallel to the plane of movement of the cover.

19 Claims, 14 Drawing Sheets

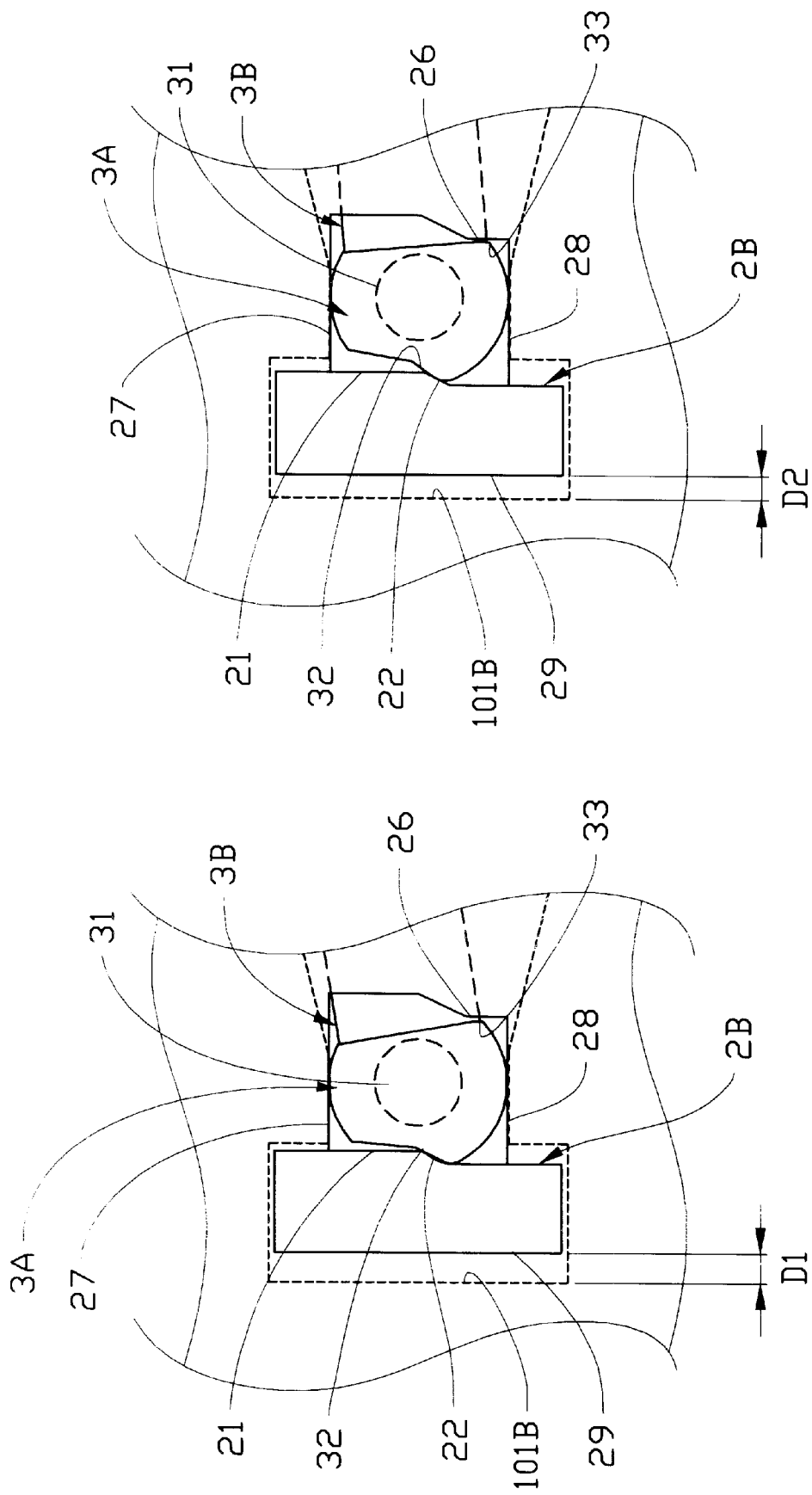

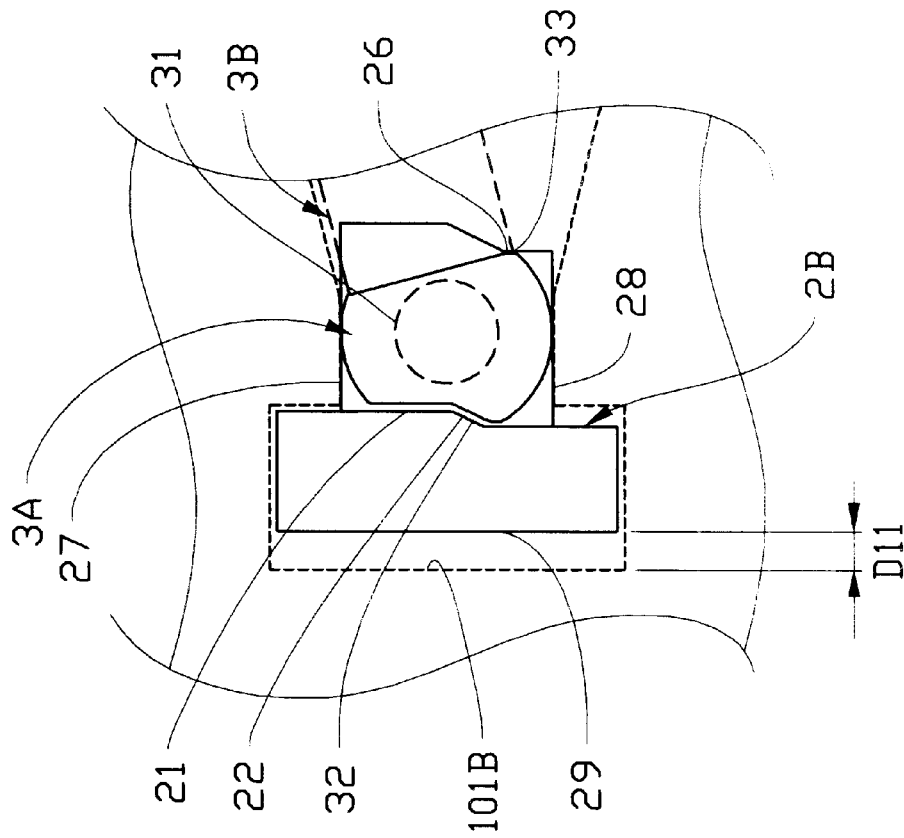
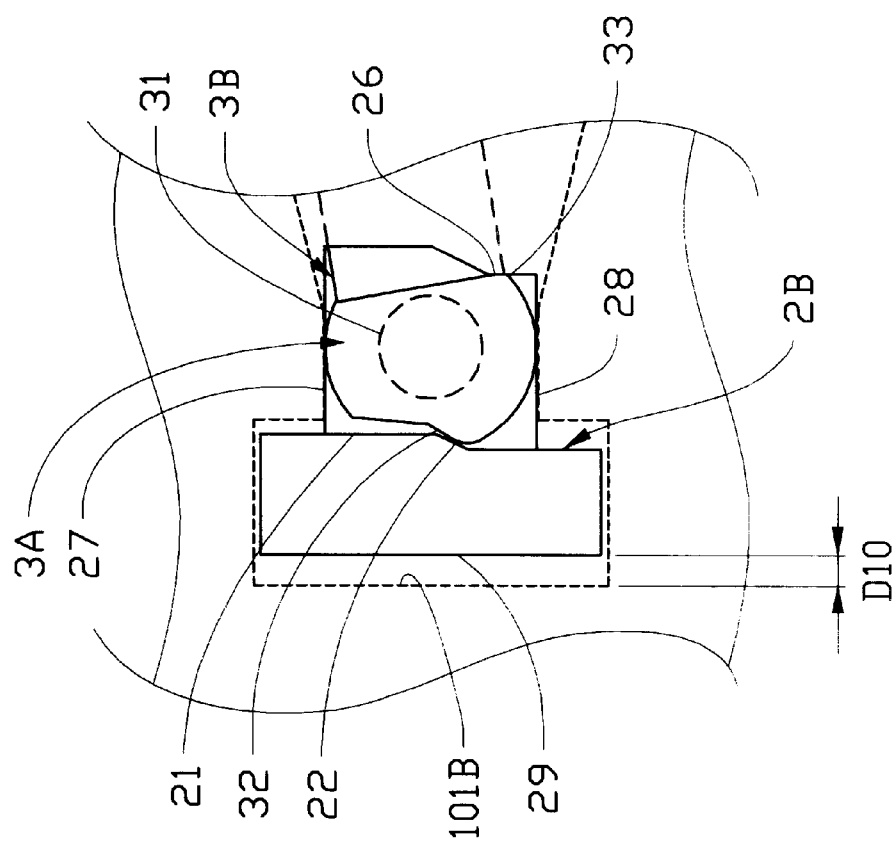

ZIF PGA SOCKET

BACKGROUND OF THE INVENTION

1. Field of the Invention

The present invention relates to a socket for a CPU, especially a ZIF PGA socket having an actuation structure by which the ZIF PGA socket is operative between a loosened state and a tightened state for receiving and securing pins of the CPU in position during insertion of the CPU into the socket.

2. The Prior Art

Conventional ZIF PGA connectors are usually installed with an actuation mechanism for controlling insertion/withdrawal of a CPU chip. This actuation mechanism is normally controlled by a handle which is often operated in a vertical manner thus positioning the socket between a loosened state and a tightened state. In the loosened state the socket is prepared for insertion of the CPU or withdrawal thereof with minimal friction. In the tightened state, the socket firmly secures pins of the CPU therein preventing withdrawal of the CPU. The operation of the handle of the actuation mechanism usually blocks nearby components due to its vertical displacement. To eliminate this problem, the handle portion of the actuation mechanism is replaced by an external tool such as a screw driver. FIGS. 19 and 20 illustrate a conventional ZIF PGA socket having a cover 100 defining a plurality of first passageways 146 therethrough and a first opening 110 in a first edge thereof. A base 300 is adapted to be slidably attached to the cover 100. The base 300 includes a plurality of second passageways 310 in alignment with the corresponding first passageways 146. Each second passageway 310 receives a contact for electrical and mechanical engagement with a pin of a corresponding component. The base 300 defines a second opening 340 at an edge thereof substantially communicating with the first opening 110 of the cover 100. The cover 100 comprises two side walls 130 extending downward from two sides thereof, each defining two recesses 135 in an interior surface thereof. The base 300 has a pair of protrusions 320 formed on opposite side walls thereof for slidable reception in the corresponding recesses 135 of the cover 100. A first slot 120 is formed in an underface of the cover 100 communicating with the first opening 110. A second slot 330 is formed in the base 300 communicating with the second opening 340. An actuation device 200 is rotatably received between the first slot 120 of the cover 100 and the second slot 330 of the base 300 and includes a central rotational section 210. Two cam sections 220 are connected to opposite ends of the central rotational section 210, and an engagement slot 215 is defined on a circumferential periphery of the central rotational section 210 of the actuation device 200 for reception of an external tool (not shown) and actuation thereby within a ninety degree range so as to move the cover 100 via the two cam sections 230 in a horizontal direction with regard to the base 300. The actuation device 200 further comprises two end rotational sections 230 connected to the corresponding cam sections 220 for facilitating rotation of the actuation device 200 upon operation by the external tool.

Although this conventional socket has solved the inconvenience mentioned above, the structure thereof is complicated and the dimension, especially the height thereof, occupies too much space thus violating the trend of compactness in the computer field. Hence, it is requisite to provide a new structure for overcoming the above disadvantages.

SUMMARY OF THE INVENTION

The primary purpose of the present invention is to provide an improved ZIF PGA socket having a compact dimension especially regarding the height thereof.

The second purpose of the present invention is to provide an improved ZIF PGA socket having a simple structure.

The third purpose of the present invention is to provide an improved ZIF PGA socket which is easy to operate.

In accordance with one aspect of the present invention, a ZIF socket comprises a longitudinal base, a cover slidably engaging with the base, and an actuation device pivotably fixed to the base for actuating the cover to move laterally with respect to the base. The cover defines a hole bound by at least a first wall and a second wall opposite the first wall. The actuation device has a cam including a forward driving portion and a backward driving portion opposite the forward driving portion, and adapted to be movably received in the hole of the cover when the cover slidably engages with the base. The forward driving portion contacts and drives the first wall of the cover to move laterally in a first direction when the cam is selectively rotated clockwise and the backward driving portion contacts and drives the second wall of the cover to move laterally in a second direction opposite the first direction when the cam is selectively rotated counterclockwise.

In accordance with another aspect of the present invention, a ZIF socket comprises a longitudinal base, a cover slidably engaging with the base, and an actuation device pivotably fixed to the base for actuating the cover to move laterally with respect to the base. The cover defines a hole bound by at least a first wall and a second wall opposite the first wall. The actuation device has a cam including a forward driving portion and a backward driving portion opposite the forward driving portion, and adapted to be movably received in the hole of the cover when the cover slidably engages with the base. The forward driving portion has a planar contact with the first wall to drive the first wall of the cover to move laterally in a first direction when the cam is rotated clockwise. The backward driving portion has a linear contact with the second wall to drive the second wall of the cover to move laterally in a second direction opposite the first direction when the cam is selectively rotated counterclockwise. A rotational plane of the cam is substantially parallel to a plane of movement of the cover.

BRIEF DESCRIPTION OF THE DRAWINGS

FIGS. 6 to 17 show different orientational relationships between a cam and two stops of the actuation device when the cover is driven to move with respect to the base;

DETAILED DESCRIPTION OF THE PREFERRED EMBODIMENTS

Figure 1:
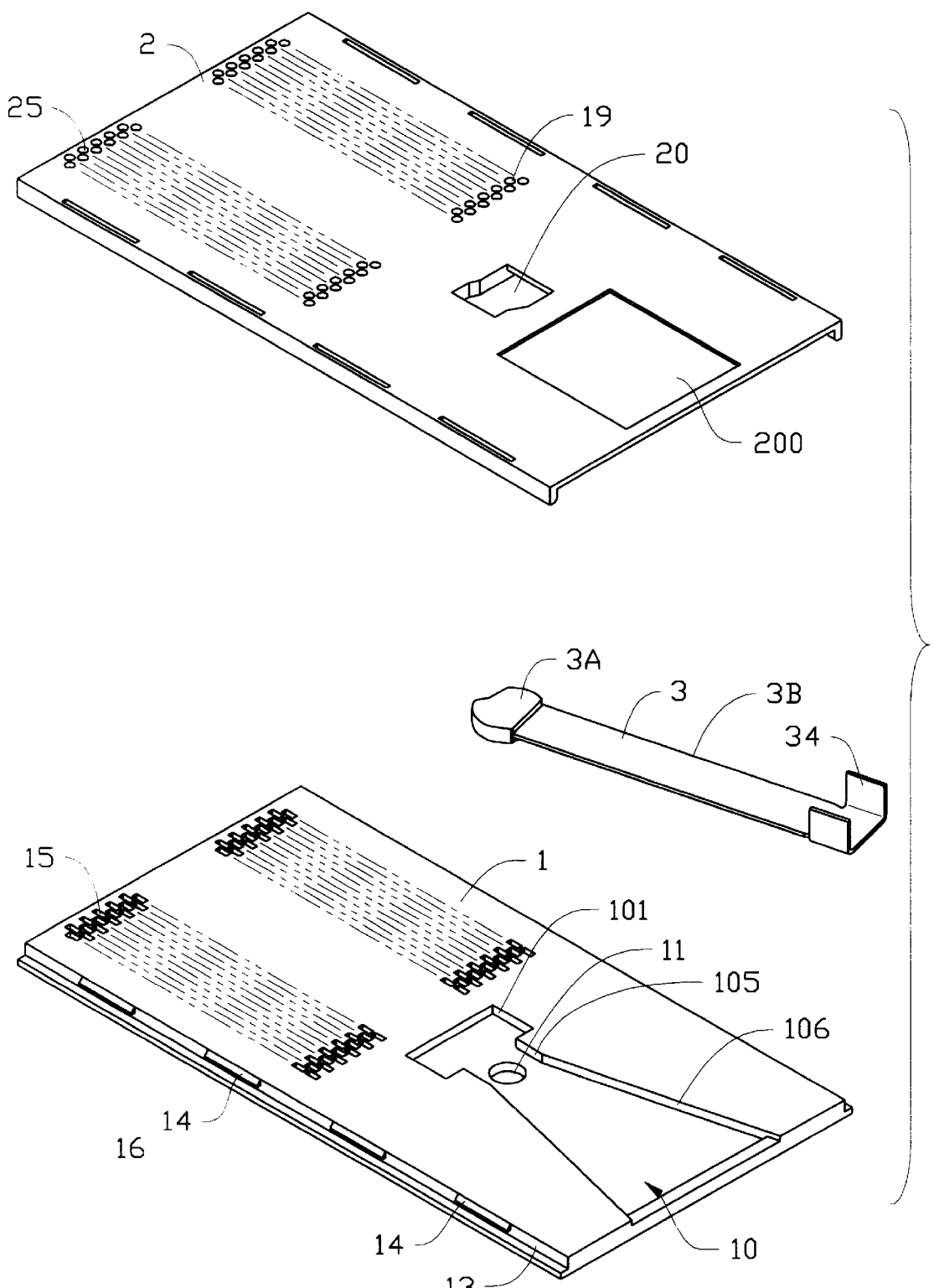
FIG. 1 is an exploded view of the ZIF socket in accordance with the present invention.

Referring to FIG. 1, a ZIF socket in accordance with the present invention comprises a longitudinal base 1, a cover 2 slidably engaging with the base 1, and an actuation device 3 pivotably fixed to the base 1. The base 1 defines a groove bound by a partial rectangular wall 101, a pair of parallel walls 105 extending from the rectangular wall 101, and a pair of diverging walls 106 extending from the parallel walls 105 to an edge of the base 1. A recess 11 is defined in a bottom of the groove 10. A plurality of first passageways 15 are defined in the base 1 for receiving contacts 16 therein. The engagement between the first passageways 15 and the contacts 16 is well known thus a detailed description thereof is omitted herein. The base 1 has two longitudinal parallel side walls 13 on which a plurality of protrusions 14 are formed.

Figure 2:
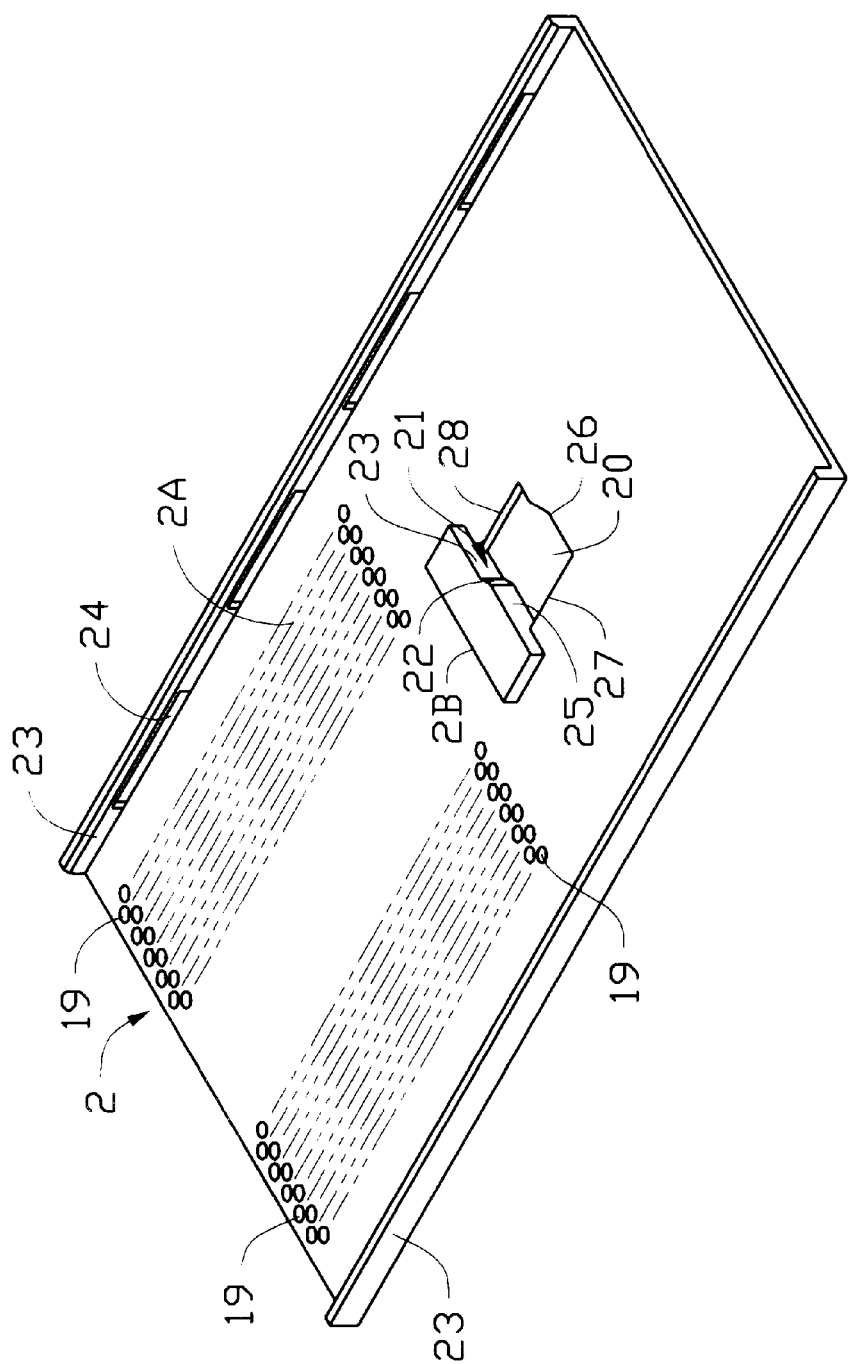
FIG. 2 is a bottom view of a cover of the ZIF socket.

Referring also to FIG. 2, the cover 2 defines a hole 20 which is bound by a forward follower side portion 21, a backward follower side portion 26 and two parallel walls 27, 28 between the side portions 21, 26. A block 2B projecting from an inner surface 2A of the cover 2 has one side portion extending vertically from the forward follower side portion 21 of the hole 20. Specifically, the forward follower side portion 21 has an oblique step wall 22 intermediate two straight walls 23, 25 of the forward follower side portion 21. The cover 2 also defines an upper recess 200 in a top surface thereof for accommodating a portion of the CPU such as a Pentium™ II module. The size of the recess 200 is specified by the shape of the CPU. Two flanges 18 extend downward from opposite longitudinal sides of the cover 2 and a plurality of recesses 24 are formed on the inner surface of each flange 18 corresponding to the protrusions 14 of the base 1. A plurality of second passageways 19 are defined through the cover 2 in alignment with the first passageways 15 of the base 1.

Figure 3:
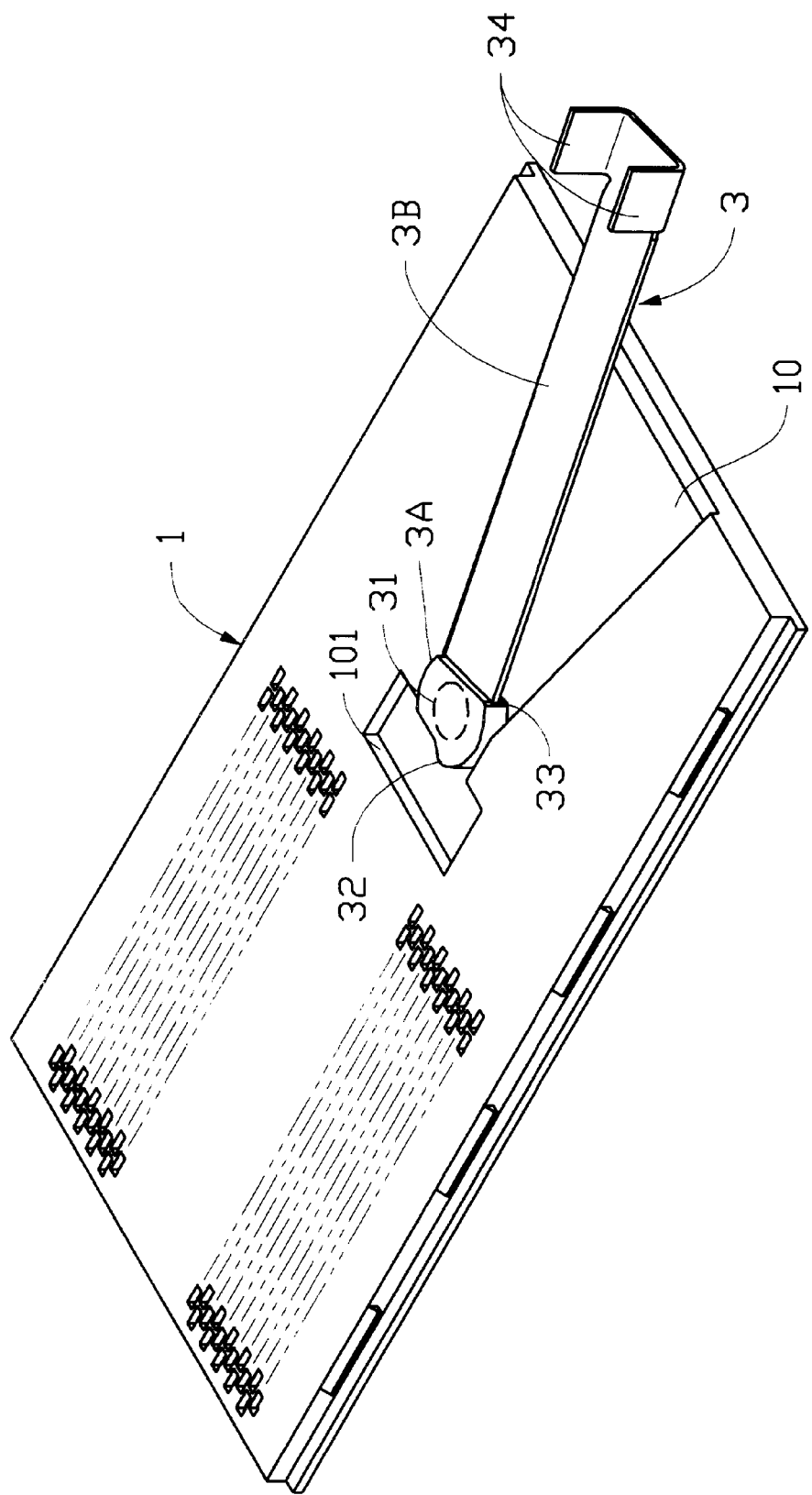
FIG. 3 shows an actuation device of the ZIF socket fixed to a base thereof.
Figure 18:
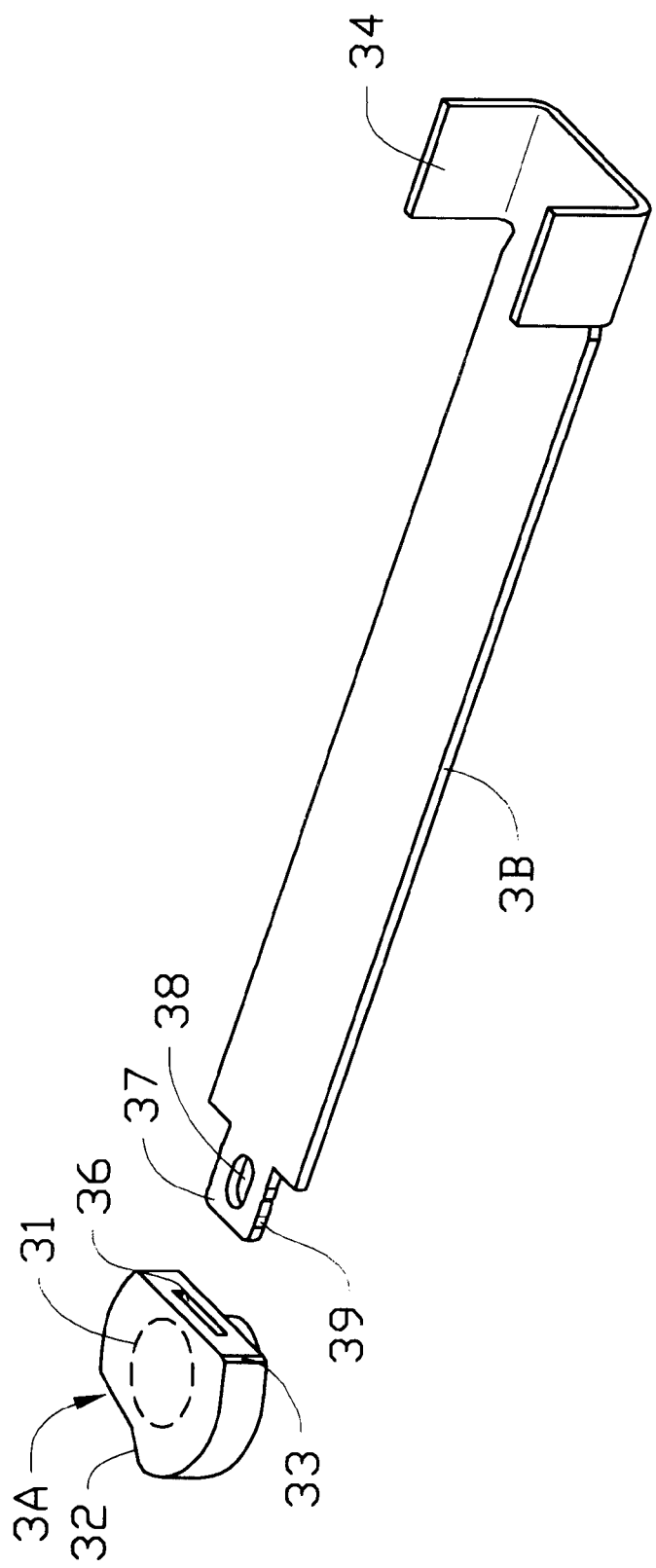
FIG. 18 is an exploded view of the actuation device in accordance with the present invention.
Figure 19:
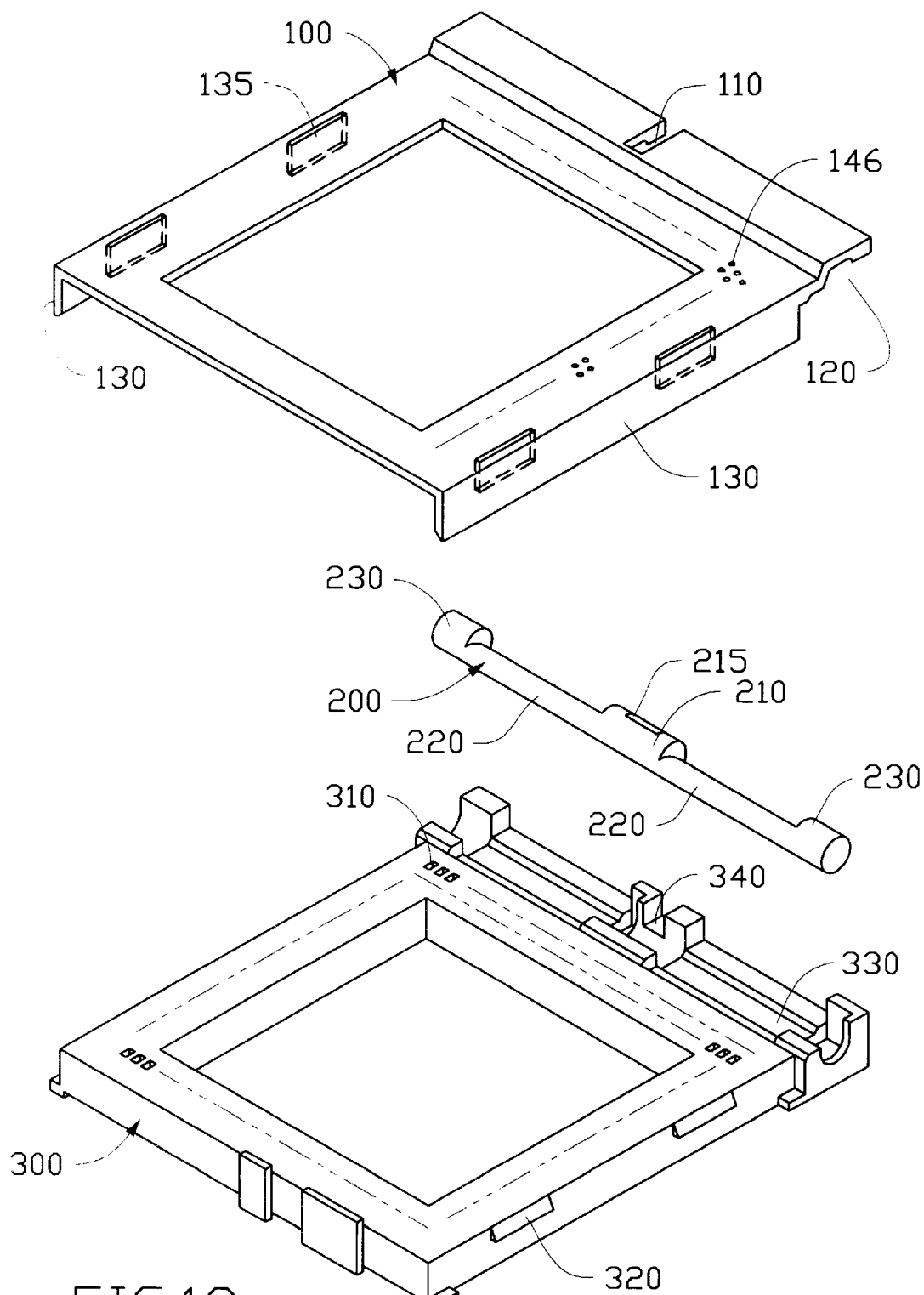
FIG. 19 an exploded view of a conventional ZIF socket.
Figure 20:
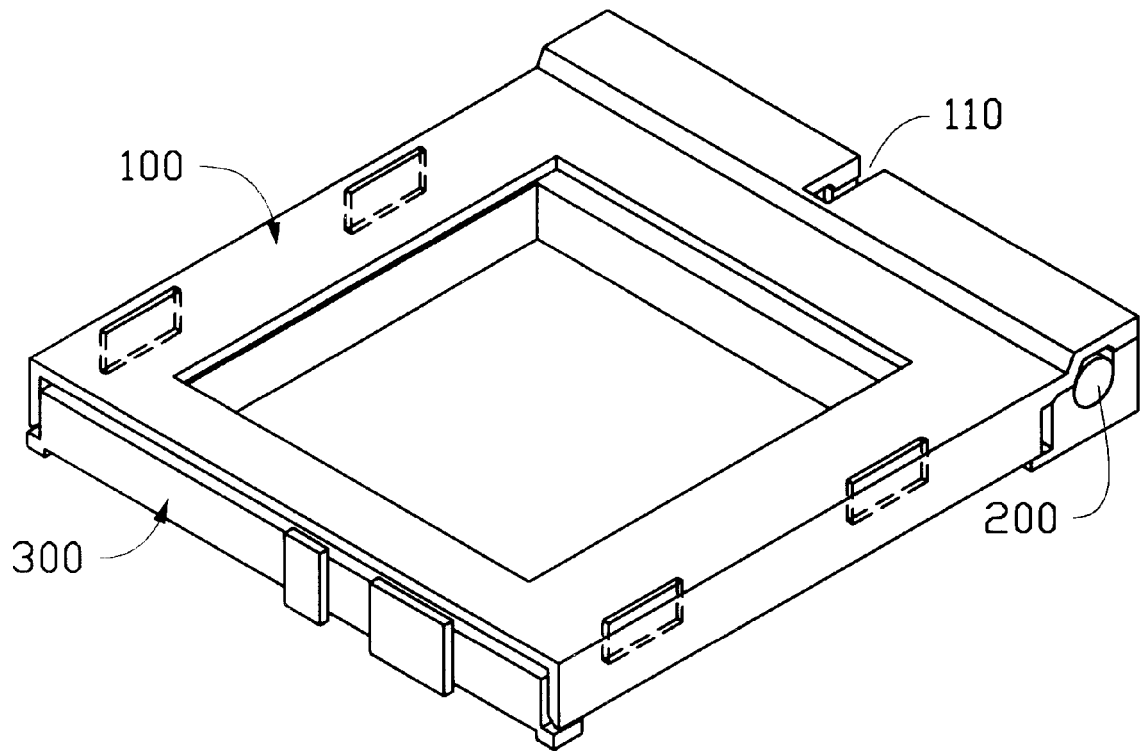
FIG. 20 is an assembled view of FIG. 19.

Further referring to FIGS. 1 and 3, the actuation device 3 includes a cam portion 3A having a pivot 31 pivotably engaging with the recess 11 of the base 1 and a handle portion 3B extending from the cam portion 3A and comprising two ears 34 extending upward from two side end portions thereof for facilitating operation by a user. The cam 3A has a forward driving portion 32 adapted to mate with the forward follower side portion 21 of the block 2B, and a backward driving portion 33 which is substantially a sharp portion opposite the forward driving portion 32. Also referring to FIG. 18, the handle 3B is made of metal while the cam 3A may be made of either metal or plastic. The cam 3A defines a recess 36 in a side thereof for engagement with the handle 3B. The handle 3B comprises a head portion 37 defining a hole 38 and has barbs 39 formed on two sides thereof for interferentially engaging with the recess 36 of the cam 3A. Alternatively, the handle 3B may engage with the cam 3A by means of insert molding, or both the cam 3A and the handle 3B may be made of metal and integrated by die casting, which is not specifically shown in this Figure.

Figure 4:
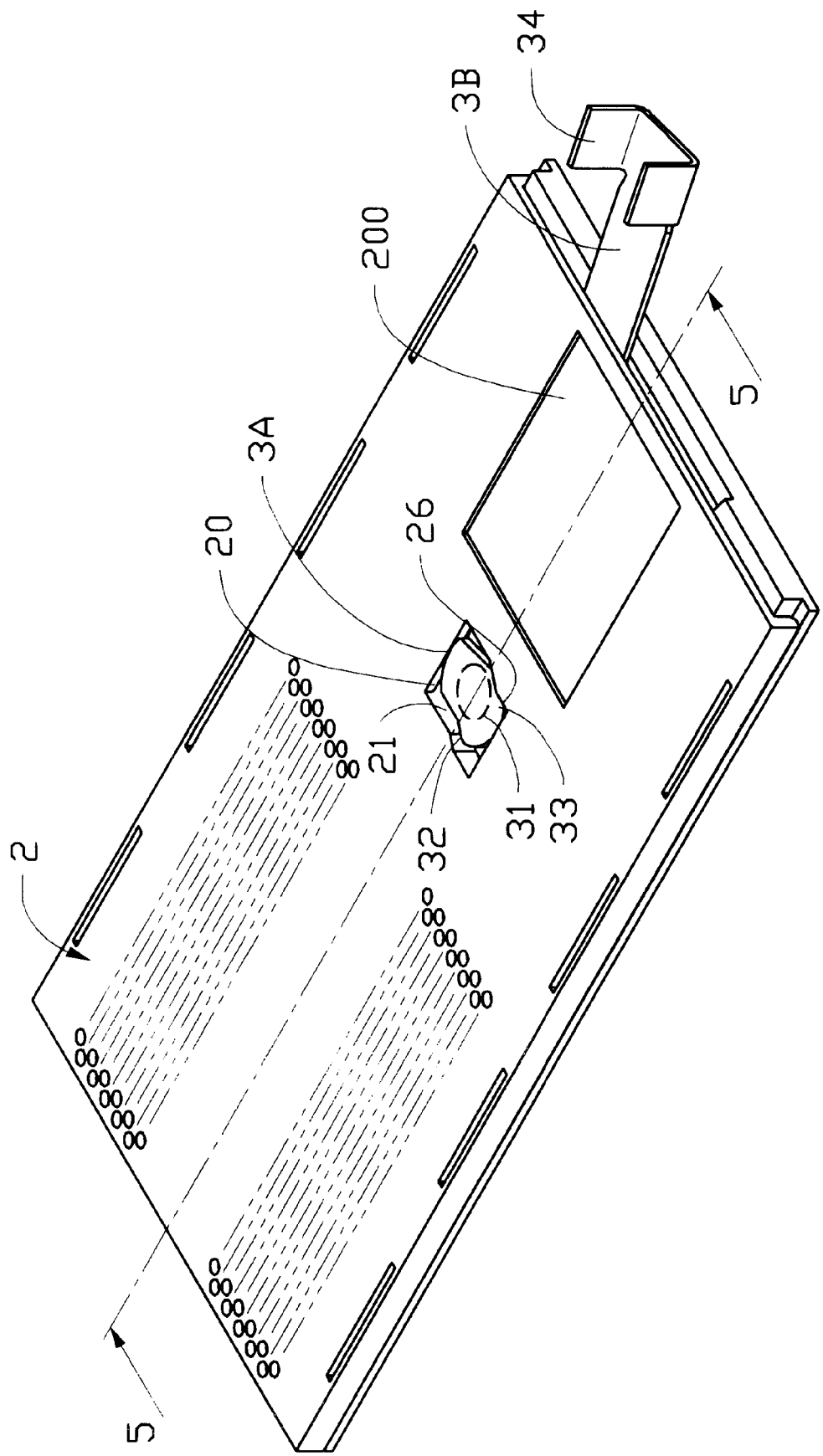
FIG. 4 is an assembled view of FIG. 1.
Figure 5:
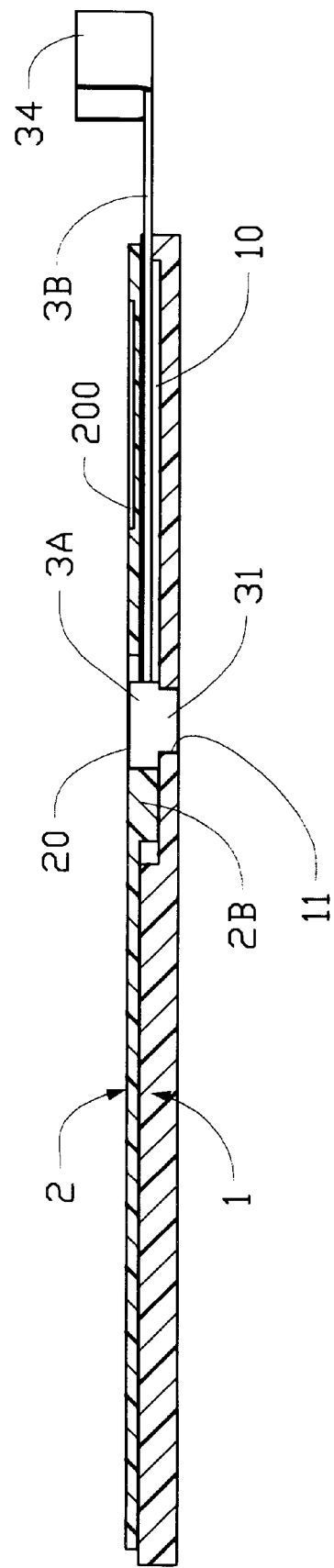
FIG. 5 is a cross-sectional view taken along line 5—5 of FIG. 4.
Figure 9:
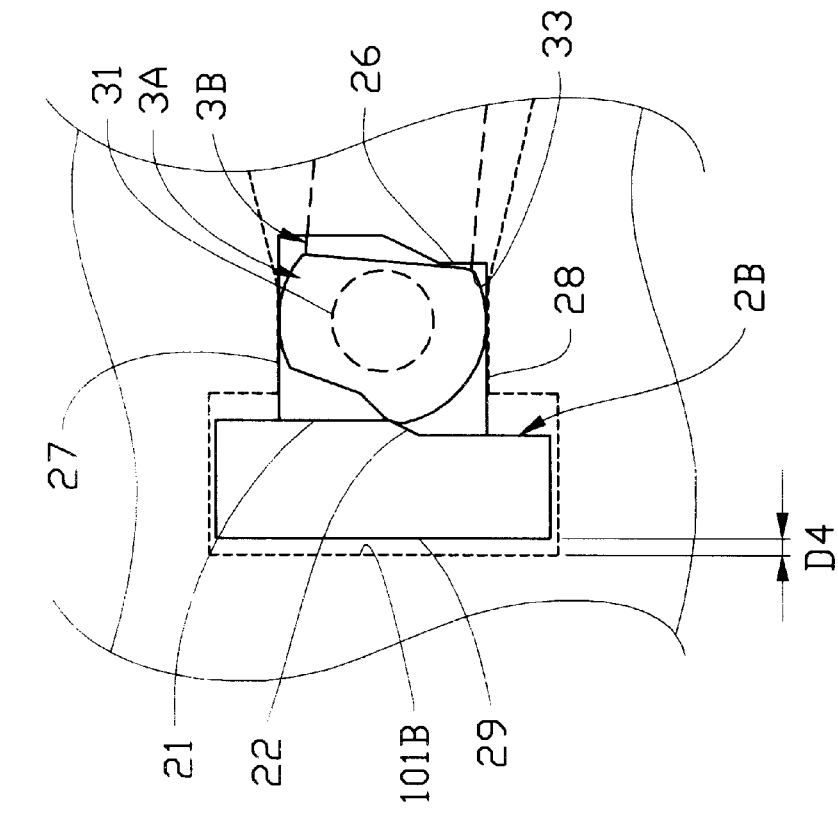
Figure 8:
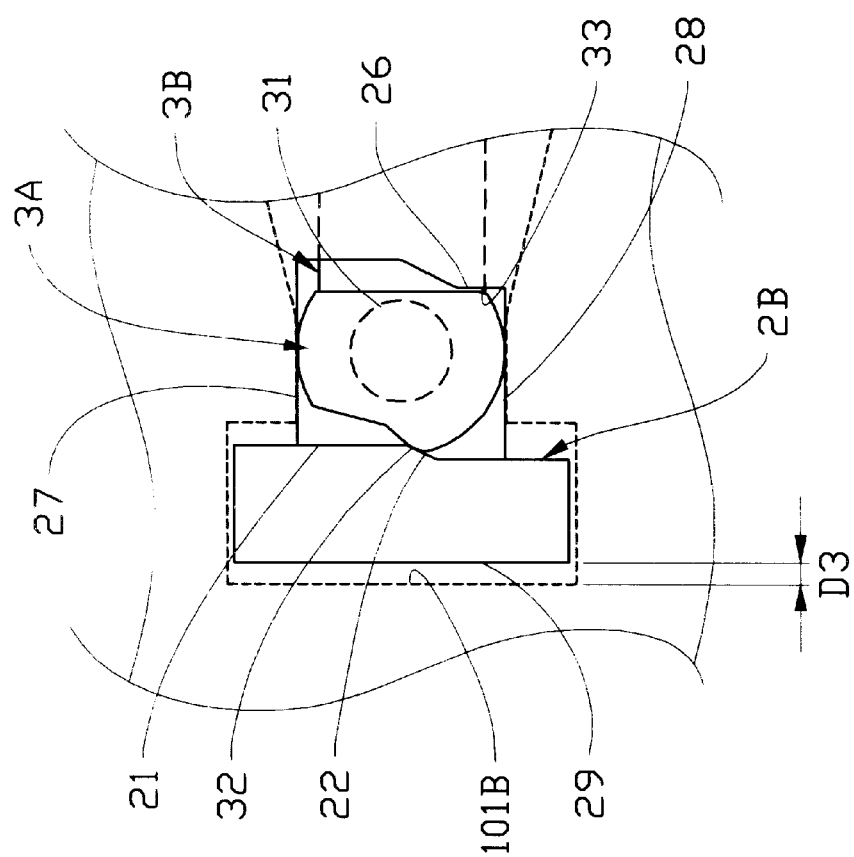

When assembled, as shown in FIGS. 4 and 5, the cover 2 is slidably engaged with the subassembly of FIG. 3 with the block 2B thereof being movably received within the rectangular wall 101 of the groove 10 of the base 1. The flanges 18 of the cover 2 loosely clip the two side walls 13 of the base 1. The recesses 24 of the flanges 18 loosely retain the protrusions 14 of the side walls 13 of the base 1 thereby allowing the protrusions 14 to move therein. The cam 3A is bound by the side portions 21, 26 and the parallel walls 27, 28 of the cover 2. Each first passageway 15 of the base 1 communicates with a corresponding second passageway 19 of the cover 2. In this assembled structure, the handle 3B of the actuation device 3 extends beyond the base 1 for operation by a user. The cam 3A alternately drives the side portions 21, 26 to force the cover 2 to move in opposite directions along a lengthwise axis thereof when the cam 3A is manually rotated clockwise and counter-clockwise, respectively. When the handle portion 3B of the actuation device 3 is manually rotated, the cam 3A will pivotably move with respect to the recess 11 of the base 1 within a predetermined angle range thereby causing either the forward driving portion 32 or the backward driving portion 33 to drive the forward follower side portion 21 or the backward follower side portion 26 to force the cover 2 to move in opposite directions parallel to the lengthwise axis of the cover 2.

The relative orientation between the cam 3A and the forward and backward follower side portions 21, 26 are explained hereinunder with reference to FIGS. 6 to 17.

Referring to FIG. 6, the socket is in a state in which a left-most edge 29 of the block 2B is separated from an inner-most wall 101B of the groove 10 by a distance D1, and the forward driving portion 32 is in contact with the oblique step wall 22 of the forward follower side portion 21. The distance between the edge 29 of the block 2B and the inner-most wall 101B of the groove 10 may be interpreted as a relative lateral distance between the cover 2 and the base 1. In this state, the handle 3B is rotated clockwise and the block 2B together with the cover 2 is forced to move laterally in a first direction with respect to the inner-most wall 101B of the base 1 until the distance between the edge 29 of the block 2B and the inner-most wall 101B becomes D2 as shown in FIG. 7, wherein D2 is less than D1. Comparing FIG. 7 with FIG. 6, the oblique step wall 22 of the block 2B slidably moves along the forward driving portion 32 of the cam 3A when driven thereby. From FIGS. 7 to 11 the handle 3B is continuously rotated clockwise in each figure at a predetermined angular displacement until the oblique step wall 22 no longer contacts the forward driving portion 32, whereby the edge 29 of the block 2B is separated from the inner-most wall 101B by a minimum distance D6 and the backward driving portion 33 is spaced from the backward follower side portion 26. It is understandable that the oblique step wall 22 of the block 2B slidably moves along the forward driving portion 32 of the cam 3A when driven thereby from FIGS. 8 to 11 so that the distance between the edge 29 of the block 2B and the inner-most wall 101B are continuously reduced from D3, D4, D5 to D6.

Figure 11:
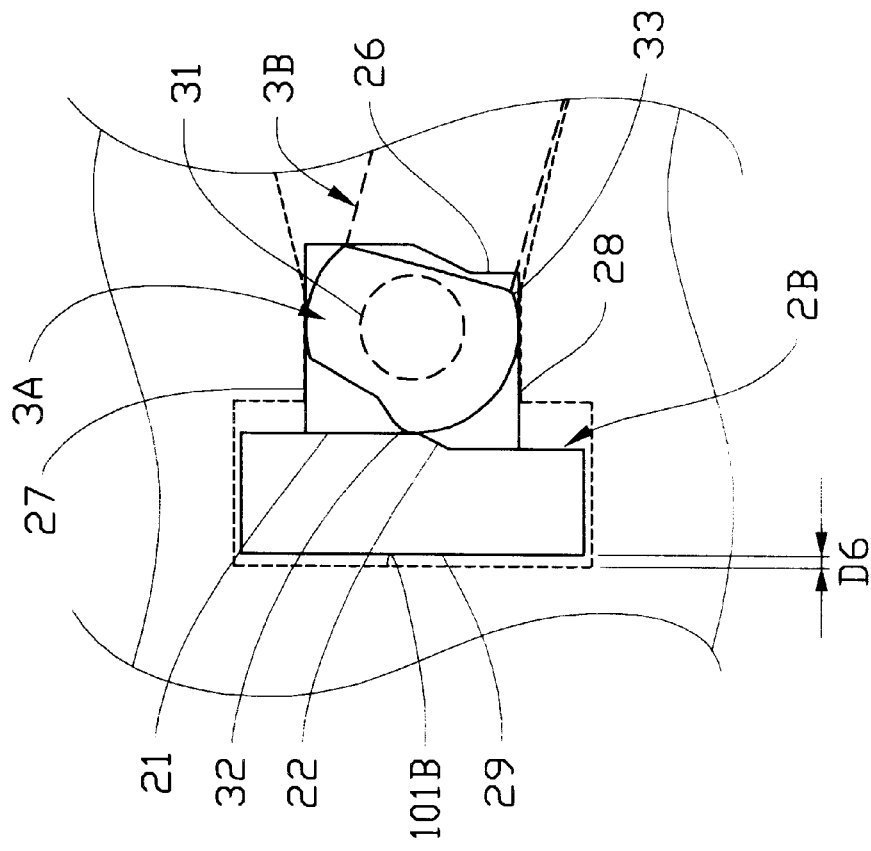
Figure 10:
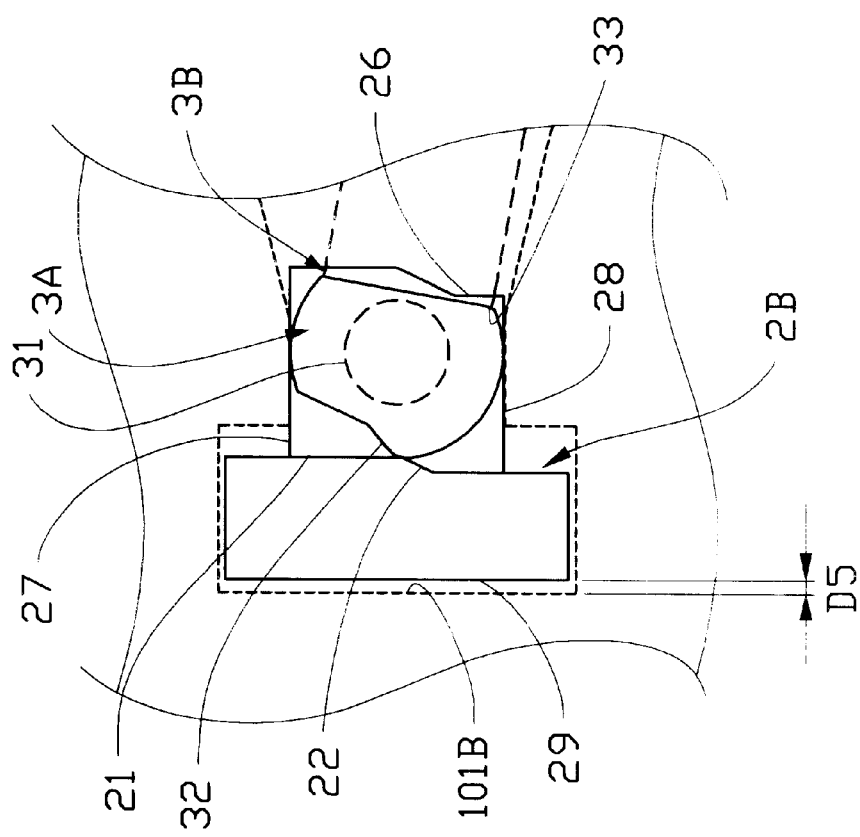
Figure 13:
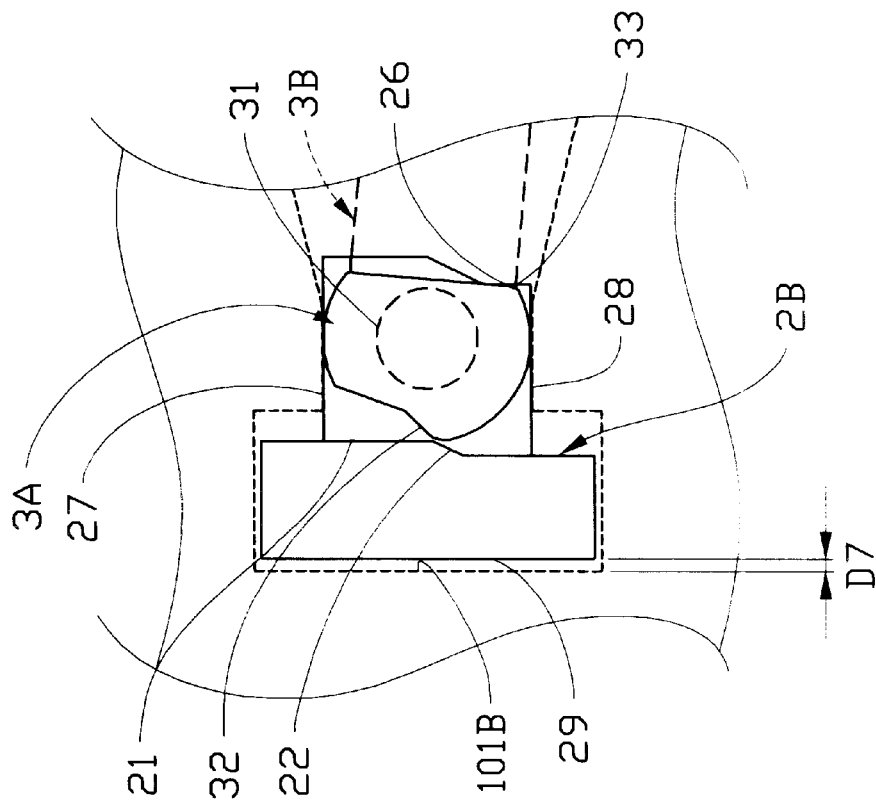
Figure 12:
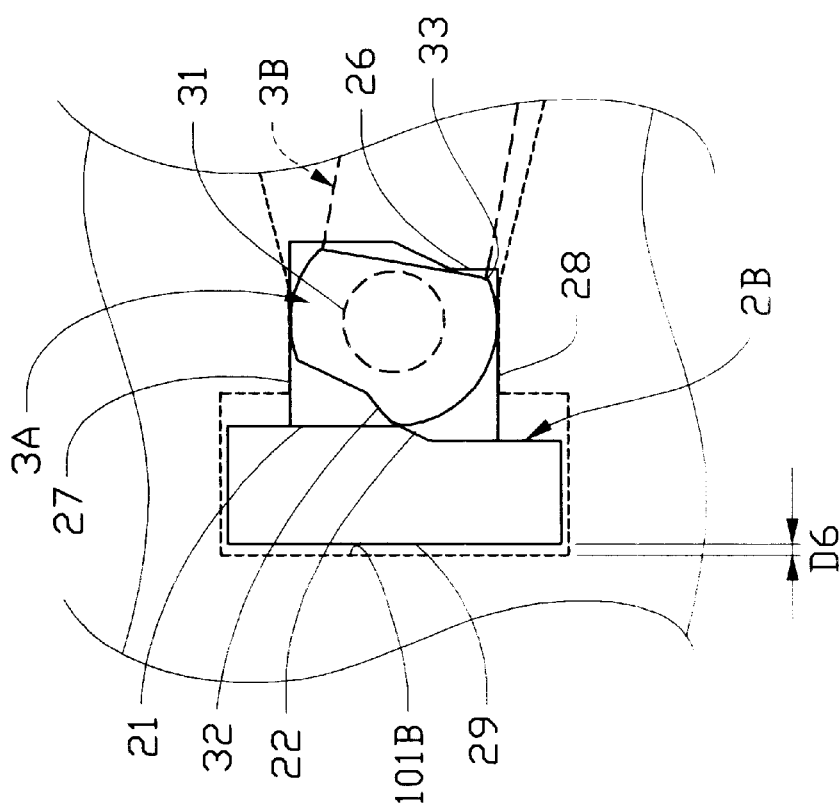
Figure 15:
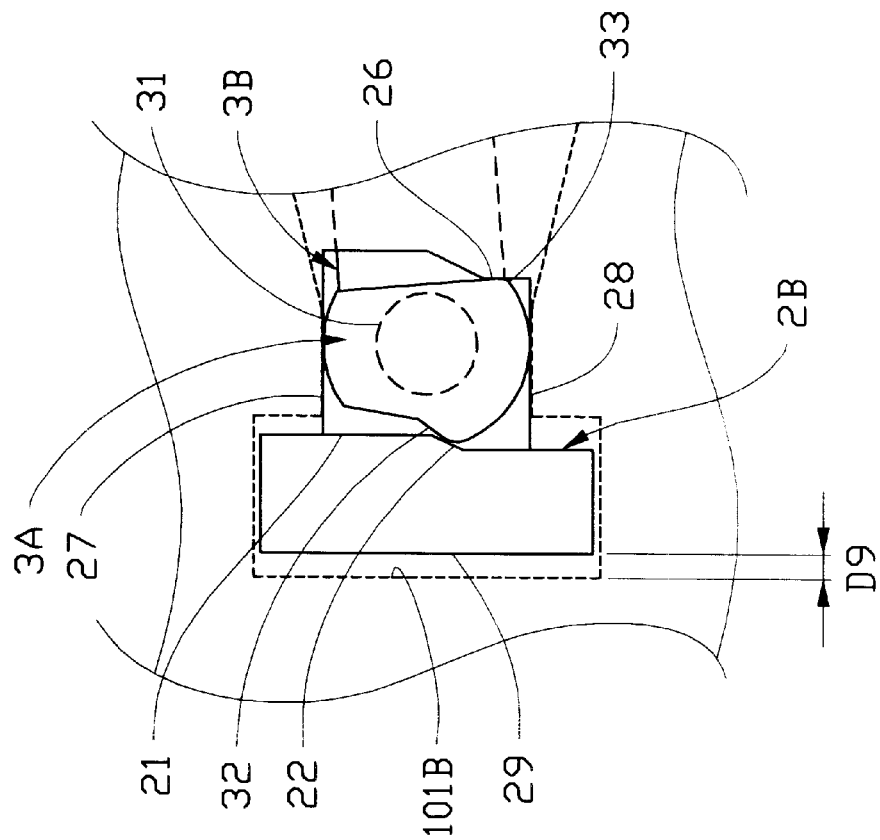
Figure 14:
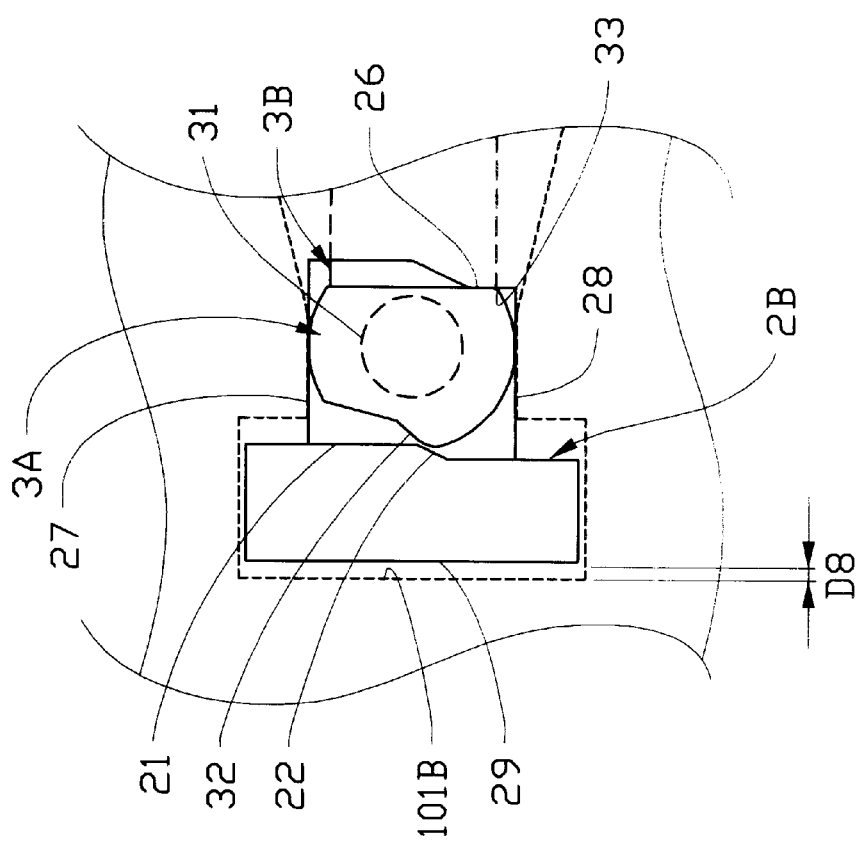

From FIG. 11 to FIG. 12, the handle 3B is rotated counterclockwise. The distance between the edge 29 of the block 2B and the inner-most wall 101B remains the same while the backward driving portion 33 contacts the backward follower side portion 26. The handle 3B is continuously rotated counter-clockwise as shown in FIGS. 13 to 17, wherein the cover 2 is driven to move laterally in a second direction opposite the first direction whereby the cover 2 returns to the state of FIG. 6.

The distance from the edge 29 of the block 2B to the inner-most wall 101B of the base 1 is increased from D7, D8, D9, D10 to D11 respectively shown in FIGS. 13 to 17. The distance D11 is identical to the distance D1 of FIG. 6. During this operation the backward follower side portion 26 of the cover 2 is driven by the backward driving portion 33 of the cam 3A which is formed as a relatively sharp angular structure to minimize the contact area with the backward follower side portion 26.

Changing from the state of FIG. 17 to the state of FIG. 6, the cam 3A is rotated clockwise a predetermined angle. During this period, the forward driving portion 32 contacts the oblique step wall 22, and the distance D11 is identical to D1.

In this embodiment, the forward driving portion 32 has a planar contact with the oblique step wall 22 to drive the latter to move laterally in a first direction when the cam 3A is rotated clockwise, while the backward driving portion 33 has a linear contact with the backward follower side portion 26 to drive the latter to move laterally in a second direction opposite the first direction when the cam 3A is selectively rotated counterclockwise. This is because moving the cover 2 in the first direction which changes the socket from a loosened state to a tightened state requires more force than to move the cover in the second direction which changes from the socket from a tightened state to a loosened state. In this embodiment, a rotational plane of the cam 3A is substantially parallel to a plane of movement of the cover 2.

While the present invention has been described with reference to a specific embodiment, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A ZIF socket comprising a longitudinal base, a cover slidably engaging with the base, and an actuation device pivotably fixed to the base for actuating the cover to move laterally with respect to the base;

the cover defining a hole bound by at least a first wall and a second wall opposite the first wall;

the actuation device having a cam including a forward driving portion and a backward driving portion opposite the forward driving portion and adapted to be movably received in the hole of the cover when the cover slidably engages with the base;

whereby the forward driving portion contacts and drives the first wall of the cover to move laterally in a first direction when the cam is selectively rotated clockwise and whereby the backward driving portion contacts and drives the second wall of the cover to move laterally in a second direction opposite the first direction when the cam is selectively rotated counterclockwise.

2. The ZIF socket as claimed in claim 1, wherein the cam has a pivot projecting therefrom and a pivotal recess is defined in a bottom of the groove for pivotably receiving the pivot of the cam.

3. The ZIF socket as claimed in claim 1, wherein the first wall of the cover is an oblique-step edge portion intermediate two straight walls binding a portion of the hole of the cover.

4. The ZIF socket as claimed in claim 3, wherein the forward driving portion of the cam is a face mating with the oblique-step edge portion of the cover whereby the oblique-step edge portion slides along the forward driving portion when the cover is driven to move in the first direction by the cam.

5. The ZIF socket as claimed in claim 4, wherein the backward driving portion of the cam is substantially a sharp portion opposite the forward driving portion.

6. The ZIF socket as claimed in claim 4 further comprising a block projecting from the cover and having one side wall thereof extending from the first wall of the hole of the cover.

7. The ZIF socket as claimed in claim 6 further comprising a handle extending from the cam.

8. The ZIF socket as claimed in claim 7, wherein a groove of the base is bound by a partial rectangular wall, a pair of parallel walls extending from the rectangular wall, and a pair of diverging walls extending from the parallel walls to an edge of the base.

9. The ZIF socket as claimed in claim 8, wherein the cam is engaged with the handle by die casting.

10. The ZIF socket as claimed in claim 8, wherein the handle of the actuation device is made of metal.

11. The ZIF socket as claimed in claim 10, wherein the cam is engaged with the handle by insert molding.

12. The ZIF socket as claimed in claim 10, wherein the cam is interferentially engaged with the handle.

13. A ZIF socket comprising a longitudinal base, a cover slidably engaging with the base, and an actuation device pivotably fixed to the base for actuating the cover to move laterally with respect to the base;

the cover defining a hole bound by at least a first wall and a second wall opposite the first wall;

the actuation device having a cam including a forward driving portion and a backward driving portion opposite the forward driving portion and adapted to be movably received in the hole of the cover when the cover slidably engages with the base, the forward driving portion having a planar contact with the first wall to drive the first wall of the cover to move laterally in a first direction when the cam is rotated clockwise, the backward driving portion having a linear contact with the second wall to drive the second wall of the cover to move laterally in a second direction opposite the first direction when the cam is selectively rotated counterclockwise; whereby a rotational plane of the cam is substantially parallel to a plane of movement of the cover.

14. A ZIF socket comprising a longitudinal base, a cover slidably engaging with the base, and a cam pivotably fixed to the base for actuating the cover to move laterally with respect to the base;

the cover defining a hole bound by at least a first wall and a second wall opposite the first wall;

the cam including a forward driving portion and a backward driving portion opposite the forward driving portion, and both the driving portions alternately and respectively driving the first wall and second wall of the hole of the cover to thus force the cover to move in opposite directions along a lengthwise axis of the longitudinal base when the cam is manually rotated in respective clockwise or counterclockwise direction, whereby a rotational plane of the cam is substantially parallel to a plane of movement of the cover.

15. A ZIF socket comprising a base (1), a cover (2) slidably engaging with the base (1), and an actuation device (3) pivotably fixed to one of said base (1) and said cover (2) for actuating the cover (2) to move laterally with respect to the base (1);

a hole (20) formed in the other of said base (1) and said cover (2), and defining a first wall (22) and an opposite second wall (26);

the actuation device (3) having a cam (3A) including a forward driving portion (32) and backward driving portion (33) for respectively driving the first wall (22) and the second wall (26) to move in opposite directions; wherein at least one of said forward driving portion (32), said backward driving portion (33), said first wall (22) and said second wall (26) is of an oblique step type.

16. A ZIF socket comprising a base, a cover slidably engaging with the base, and an actuation device pivotably fixed to said base for actuating the cover to move laterally with respect to the base;

a hole formed in said cover; and the actuation device having a cam with a raised thickness for being received within the hole so as to be visibly exposed to an exterior.

17. The socket as claimed in claim 16, wherein said base includes a groove to receive a block downward extending from the cover.

18. The socket as claimed in claim 16, wherein the actuation device further includes a handle extending outwardly horizontally from the cam.

19. The socket as claimed in claim 18, wherein said handle further includes a distal end extending out of an edge of the base and exposed to an exterior for easy operation.

* * * * *